United States Patent [19]

Buchanan et al.

[11] Patent Number: 4,995,815

[45] Date of Patent: Feb. 26, 1991

[54] COAXIAL TRANSMISSION LINE TO STRIP LINE COUPLER

[75] Inventors: W. A. Buchanan, E. Hampstead, N.H.; G. L. Heiter, Andover, Mass.

[73] Assignee: AT&T Bell Laboratories, Murray Hill, N.J.

[21] Appl. No.: 488,819

[22] Filed: Feb. 26, 1990

[51] Int. Cl.[5] .............................................. H05K 1/00

[52] U.S. Cl. .................................... 439/63; 439/581

[58] Field of Search ............................... 439/578–585, 439/675, 63, 55; 333/33, 245, 246, 260, 261

[56] References Cited

U.S. PATENT DOCUMENTS

| | | | |
|---|---|---|---|
| 3,686,624 | 8/1972 | Napoli et al. | 439/581 |
| 4,603,926 | 8/1986 | Nesbit et al. | 439/63 |
| 4,867,704 | 9/1989 | Standke | 439/581 |

FOREIGN PATENT DOCUMENTS

| | | | |
|---|---|---|---|
| 2748818 | 11/1979 | Fed. Rep. of Germany | 439/581 |

*Primary Examiner*—David L. Pirlot
*Attorney, Agent, or Firm*—Eli Weiss

[57] ABSTRACT

In accordance with the principles of the present invention, a connector for coupling a coaxial transmission line to a strip transmission line comprises a length of transmission line having an inner conductor having a longitudinal axis, an annular ring of dielectric material disposed around the inner conductor and an outer conductor. The length of transmission line at one end, is coupled to a coaxial transmission line connector. The other end of the transmission line is mounted to a printed wiring board which supports a controlled impedance strip transmission line and the inner conductor, which projects beyond the dielectric material immediately adjacent the strip transmission line, is electrically coupled to the strip transmission line. The ground plane, located either on the same side or the obverse side of the printed wiring board is coupled to the outer conducting member of the length of transmission line either directly or via a conductive trace.

5 Claims, 3 Drawing Sheets

COAXIAL TRANSMISSION LINE TO STRIP LINE COUPLER

TECHNICAL FIELD

This invention relates generally to an electromechanical assembly and more particularly to a connector for coupling a coaxial transmission line to a strip transmission line located on the component side of a printed wiring board.

BACKGROUND OF THE INVENTION

In the electronics manufacturing industry, printed wiring boards, also known as printed circuit boards, are frequently used for mounting large numbers of devices such as hybrid circuits, integrated circuits, individual components and the like. A printed wiring board normally contains a pattern of conductive traces on the surfaces of the board; and the board acts as a dielectric material for electrically coupling the various devices in a desired configuration. Two or more printed wiring boards can be interconnected through connecting pads, connectors and a backplane. A printed wiring board can comprise either a single dielectric sheet or a plurality of dielectric sheets laminated together into a more or less rigid laminated board. The sheets carry the conductive traces or paths which interconnect the component pads affixed to the board. Some of the conductive paths connect with connecting pads which are located on the board at or near an edge of the board for purposes of making connections to circuitry located external to the board. Frequently only one of the 4 edges is available for such connections. It is desirable to establish such connection at arbitrary locations throughout the interior of the board.

In data processing systems, the need has arisen to transmit to or receive from arbitrary locations on a printed wiring board high speed data streams having bit rates which extend into the microwave region, for example, a 2.488 GHz clock signal and data connections at the electro-optic interfaces of light wave systems. In these instances the conductive traces are designed to perform as controlled impedance transmission lines. A controlled impedance transmission line retains the desired characteristic impedance (for example, 50 ohms) at the interconnection to frequencies extending into the microwave region. Examples of controlled impedance transmission lines are a strip transmission line, a microstrip transmission line and a coplanar waveguide transmission line.

In one type of assembly, the printed wiring board can include, as the conductive path, a microstrip transmission line affixed to one side of a dielectric sheet and a relatively wide flat conductor affixed to the opposite side of the dielectric sheet. A second dielectric sheet is positioned against over the side of the first dielectric sheet having the relatively wide flat conductor and a connector for a coaxial transmission line is coupled to the exposed side of the second dielectric sheet. It is to be noted that the exposed side of the second dielectric sheet is not required to support any conductive paths. The coaxial connector is coupled to the conductive paths which can be a trace or strip transmission line located on the far side of the board assemblage by means of an opening in the board through which conductive wires can pass. One wire extends through the opening in the dielectric sheets from the center lead of the coaxial connector to a conductive trace on the far side of the first dielectric sheet. A second connection is made from the body of the coaxial connector to a conductive pad also located on the far side of the first dielectric sheet, for coupling the body of the connector to the relatively wide flat conductor which defines the ground plane located between the two dielectric sheets.

The conductors which pass through the dielectric sheets to connect the coaxial connector to the strip transmission line and ground plane cause an abrupt change in the physical characteristics of the line which, in turn, cause an abrupt change in the characteristic impedance of the line. The line, therefore, losses its controlled impedance performance. This change introduces objectionable electrical performance and losses to the signal being propagated between the strip transmission line and the coaxial transmission line. An improved coaxial transmission line to strip transmission line coupler is required to reduce this deleterious condition.

SUMMARY OF THE INVENTION

In accordance with the principles of the present invention, a coupler for coupling a coaxial transmission line to a strip transmission line comprises a length of coaxial transmission line having an inner conductor having a longitudinal axis, an annular ring of dielectric material disposed around the inner conductor and a concentric outer conductor. The coaxial transmission line, at one end, is coupled to a coaxial transmission line connector. The other end of the transmission line, is adapted to be mounted to the side of a printed wiring board which supports the strip transmission line. The very end of the inner conductor, which extends beyond the annular ring of dielectric material, is electrically coupled to the strip signal transmission line on the printed wiring board and the outer conductor is coupled electrically to the ground plane, which is coupled to the printed wiring board.

DETAILED DESCRIPTION

Figure 1:
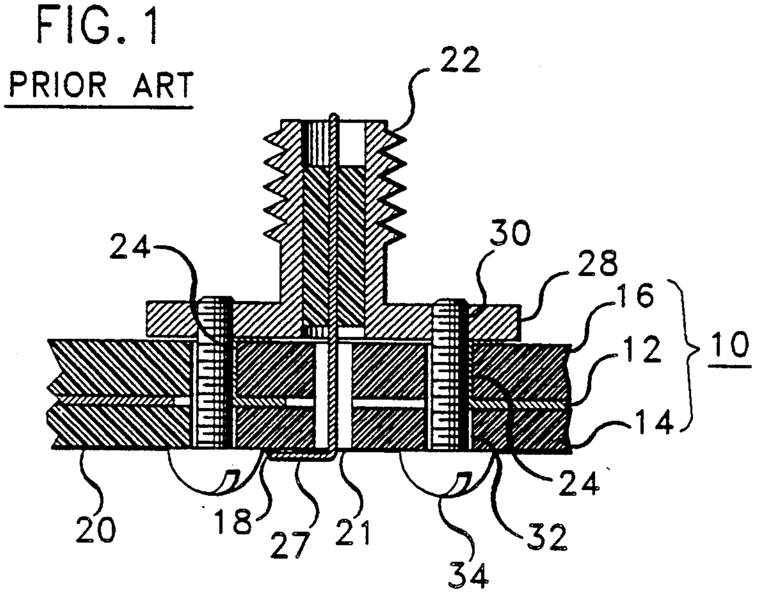
FIG. 1 PRIOR ART
FIG. 1 is a side sectional view representative of a prior art strip transmission line-to-coaxial transition.

Referring to FIG. 1, there is illustrated a side section view of a printed circuit or printed wiring board coupled to a coaxial connector for establishing a propagation path between a strip transmission line and a coaxial cable. A coaxial cable is capable of propagating signals which can extend into the microwave region. It is to be noted that there is no difference between a strip transmission line-to-coaxial transmission line transition and a coaxial transmission line-to-strip transmission transition, the two being the same.

A printed circuit or printed wiring board 10 can comprise a ground plane 12 positioned between a bottom dielectric layer 14 and a top dielectric layer 16. Strip transmission lines 18, for establishing conductive paths between components, are mounted on or are a part of the board at discrete locations on the outer surface 20 of the bottom dielectric layer 14.

At a predetermined location on the board 10 a cutout 21 is provided for a coaxial connector 22. The cutout 21 is positioned to be in close proximity to the portion of the strip transmission line 18 that is to be coupled to a coaxial connector. The ground plane 12 is coupled to a conductive trace 24 which provides a conductive path from the ground plane 12, to the bottom surface of dielectric layer 14, and the top surface of dielectric layer surface 16. Conductive trace 24 provides an electrical connection between the ground plane 12 and the housing 28 of the connector 22.

A coaxial connector 22 is positioned on top of the top dielectric layer 16 and resides over the cutout 21 such that the center conductor 27 of the coaxial connector extends through the cutout 21. In FIG. 1, the coaxial connector 22 can be a flange mount back receptacle of the type manufactured by M/A-Com Omni Spectra, Inc. of Merrimack, N.H. The coaxial connector contains a flange 28 which can have four mounting cutouts 30 taped to accept a round head machine screw 34 of an appropriate size. The four cutouts 30 in the flange 28 are aligned with four cutouts 32 located in the board 10. Four machine screws 34, which are positioned within the cutouts 32 are threaded into cutouts 30 in flange 28 to rigidly secure the coaxial connector 22 to the board 10. It is to be noted that the cutouts 32 are positioned to avoid interfering with the strip transmission lines 18 located on the lower surface of the dielectric layer 14 while the ground plane 12 is designed to pass through the opening 32 to contact the flange 28 both directly and via the mounting screws 34. It is also to be noted that the coaxial connector is mounted to the side of the board 10 which does not support the strip transmission lines 18.

The center conductor 27 of the connector 22 projects through the opening 21 and extends beyond the bottom surface of layer 14. To establish a conductive path, the end of center conductor 27, is bent over to contact the appropriate strip transmission line 18, and a permanent connection can be made between the conductor 27 and the conductive trace 18 with solder.

The drastic changes in geometry from the coaxial geometry of connector 22 to the strip transmission line 18 with its ground plane 12 introduces discontinuities which have a deleterious effect on the propagation of high frequency energy.

Figure 2:
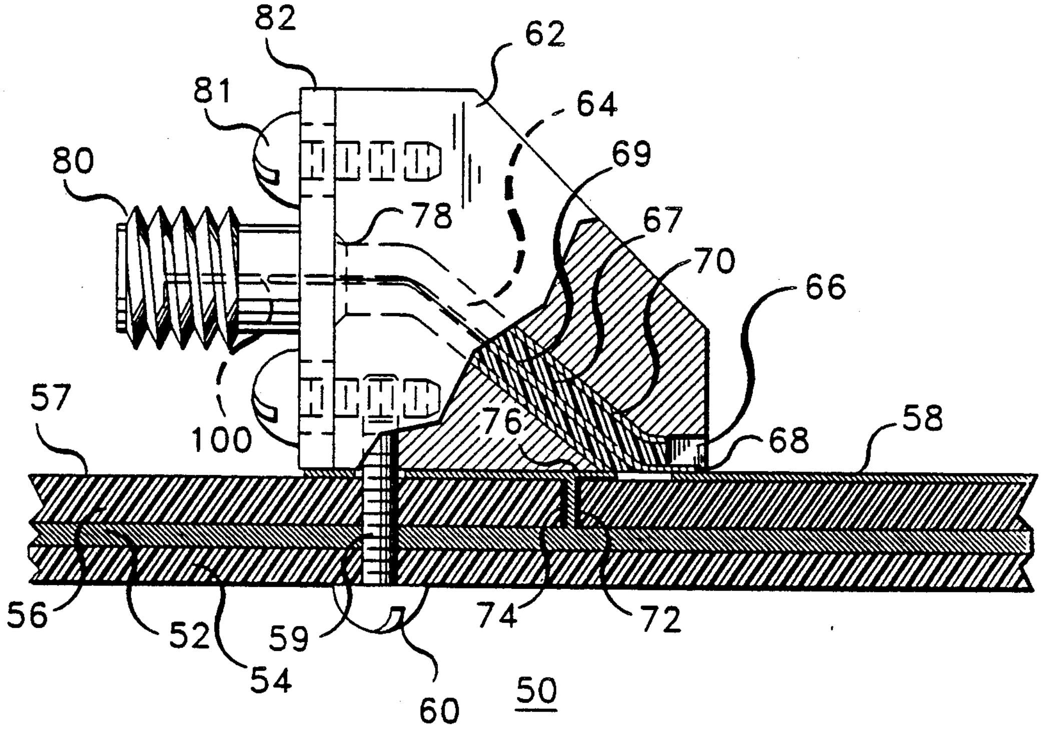
FIG. 2 is a side sectional view of a strip transmission line-to-coaxial transition in accordance with the principles of the invention.

Referring to FIG. 2, there is illustrated a cutaway side view of structure in accordance with the principles of the invention for materially reducing the adverse effects associated with coupling a strip transmission line to a coaxial transmission line conductor via a prior art coaxial connector.

As noted above in FIG. 1, a wiring board 50 is comprised of a ground plane 52 positioned between a bottom dielectric layer 54 and a top dielectric layer 56. Conductive traces 58 such as a microstrip, a transmission line, a coplanar waveguide transmission line pattern or a strip transmission line for establishing controlled impedance conductive paths between components are supported on the outer top surface 57 of the top dielectric layer 56.

At predetermined locations on the board 50, clearance cutouts 59 are provided for machine screws 60. The clearance cutouts 59 are positioned to avoid interfering with the strip transmission lines 58 on the top surface 57 of the top dielectric layer 56. The ground plane 52 can be recessed from cutouts 59 to prevent the ground plane from contacting mounting screws 60 or the ground plane can come to the edge of cutouts 59 to permit the ground plane to contact member 62 via mounting screws 60.

Figure 5:
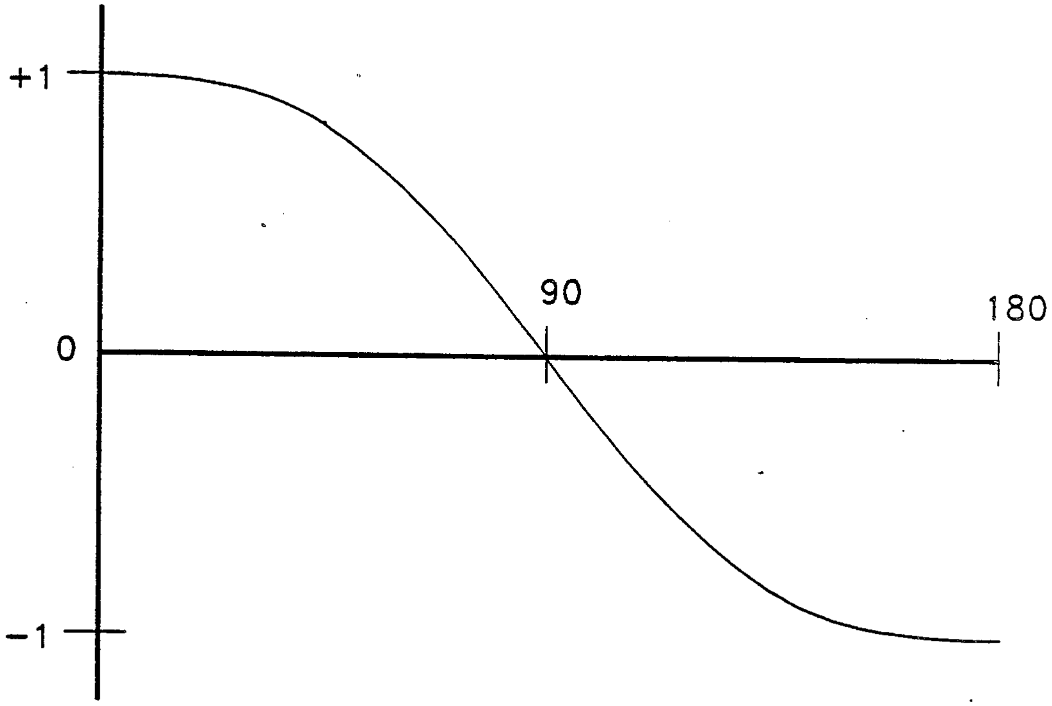

Mounting member 62, which can be made of either a conductive material, or of a non-conductive material, is secured rigidly to the top surface of the top dielectric layer 56 by means of machine screws 60 which pass through clearance cutouts 58 and thread into member 62. If desired, screws 60 can be replaced by mounting pins which can be soldered to the conductive path on the bottom of dielectric layer 54. Member 62 provides support for coaxial transmission line 64 and coaxial connector 80. Coaxial transmission line 64 can be semi-rigid or flexible and can be urged to assume a shape which can be characterized as resembling the trace of a portion of a cosine wave, for example, the trace of the portion of a cosine wave which extends from 0° to 180° as illustrated in FIG. 5.

The outer conducting member 70 and the dielectric insulation 67 at the bottom end portion 66 of the coaxial transmission line 64 is removed to expose an end 68 of the center conductor 69. The lower end 68 of the center conductor 69 projects slightly beyond the end of the dielectric insulation 67 and, when positioned on the printed wiring board, extends over the top surface of the strip transmission line 58. Positive contact between the end 68 of the center conductor 69 and the strip transmission line 58 can be provided by soldering the two together.

A cutout 72 in the top dielectric layer 56 provides a passage for a conductor 74 to connect the ground plane 52 to a conductive pad 76 located on the surface 57 of the top dielectric layer 56. Conductive pad 76 can be positioned to make contact with the outer conducting member 70. If desired, the outer conducting member 70 can be soldered to conductive pad 76 to provide positive electrical contact. In those instances where member 62 is composed of a conductive material such as brass, bronze, aluminum, copper or the like, it may be desired to position the conductive pad 76 to be between the member 62 and the top dielectric layer 56, and soldering may not be required. It is also noted that, where the member 62 is conductive, it may be desirable to allow member 62 to become the conducting member 70 and thus the outer conducting member 70 of the coaxial transmission line 64 can be eliminated. Obviously, if member 62 is made of a material which is not conducting, and its surface is not treated by plating or the like to be conducting, then a separate outer conducting member 70 of the coaxial transmission line is required.

The upper terminal end 78 of the coaxial transmission line 64 can be coupled to a standard bulkhead connector 80 such as model 9954-0081-6620 manufactured by Dynawave Incorporated of Georgetown, Mass. Connector 80 can be secured to a side surface of mounting member 62 by means of machine screws 81. It is to be noted that the center conductor 100 of connector 80 is a metal tube which has an inside diameter which fits over the center conductor 69 of the coaxial transmission line 64. The outer conductor of the coaxial transmission line can be positioned between the mounting member 62 and the flange 82 of the bulkhead connector to provide a positive electrical connection between the body of the bulkhead connector and the outer conducting member of the coaxial transmission line.

Figure 3:
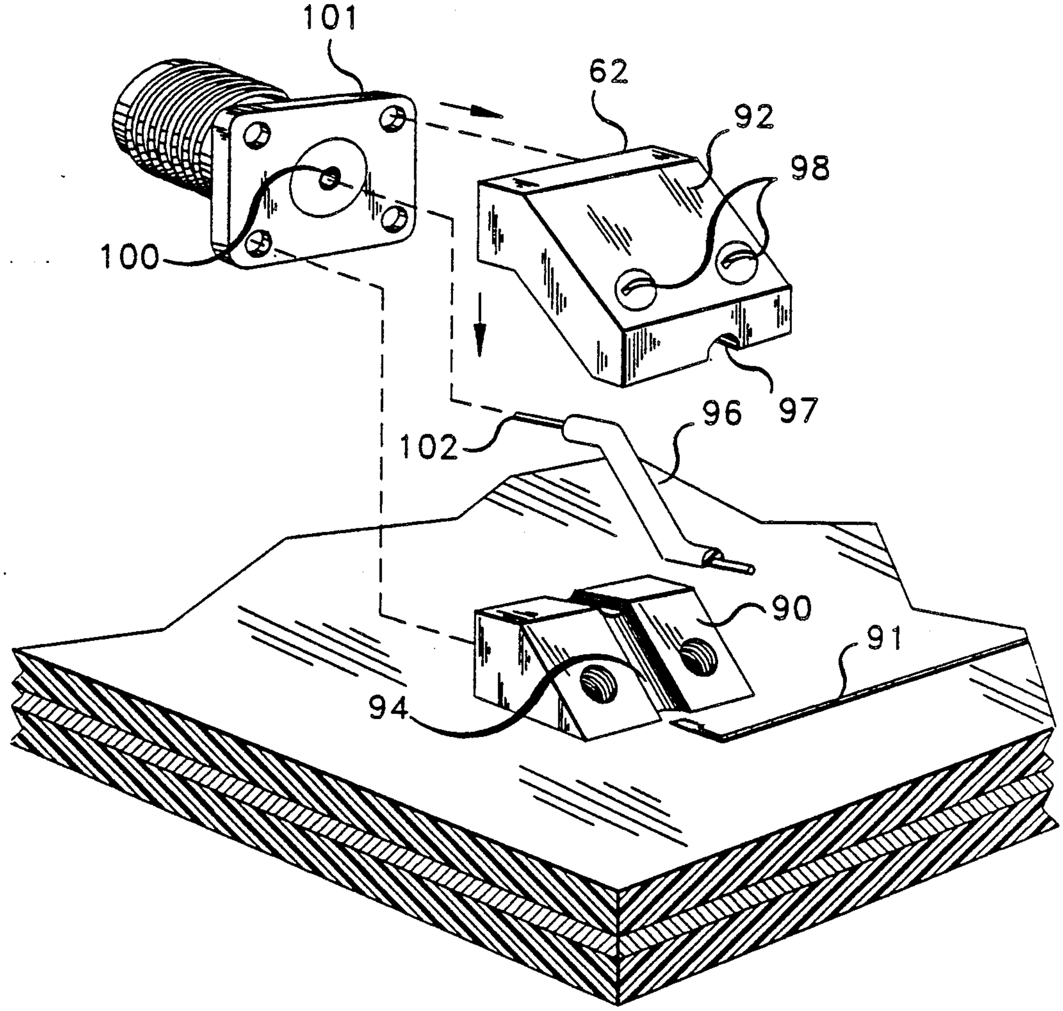
FIG. 3 is an exploded view of a strip transmission line-to-coaxial transition connector in accordance with the principles of the invention.

Referring to FIG. 3, there is illustrated an exploded view of the strip transmission line-to-coaxial transmission line connector. In this illustration, the member 62 is composed of brass and the coaxial transmission line 96 is semirigid, it being understood, however, that the member 62 can be comprised of other material and that the coaxial transmission line 96 can be flexible and, where the member 62 is conductive, the outer conductor of the coaxial transmission line can be eliminated.

Figure 4:
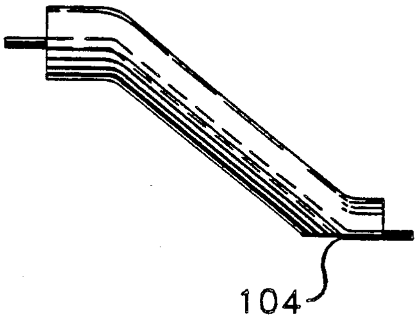
FIG. 4 is an expanded side view of a coaxial transmission line of the strip transmission line-to-coaxial transition connector; and, FIG. 5 is a plot of a portion of a cosine curve which is representative of the shape of the coaxial transmission line located within the coaxial transmission line-to-strip transition coupler.

It is also to be understood that conductive trace or line 91 can be in the form of a microstrip transmission line, a coplanar waveguide type of transmission line or a strip transmission line geometry. In this embodiment, the mounting member 62 can be formed of two members, a lower member 90 and an upper member 92. The lower member 90 supports a slot 94 which accommodates, in this embodiment, a semirigid coaxial transmission line 96 bent into a partial cosine type of shape as illustrated in FIG. 5. The coaxial transmission line 96, which is more clearly illustrated in FIG. 4, fits into slot 94. The upper member 92 fits on top of the lower member and contains a slot 97 which is sized to accept the upper portion of the coaxial transmission line. Machine screws 98, which pass through the upper member and are threaded into the lower member, lock the lower member to the upper member and hold the coaxial transmission line captive. The center sleeve conductor 100 of the bulkhead connector 101 is slidably coupled to the projecting center end 102 of the coaxial transmission line 96 and the connector is then coupled to the upper and lower members 90 and 92 by means of machine screws. Machine screws, which can pass through clearance openings in a printed wiring board are threaded into the assembled member 62 to lock it to a printed wiring board.

It is to be noted that the connector here disclosed is mounted on the side of a printed wiring board which supports the strip transmission lines. This is exactly the opposite of the prior art connectors which are not mounted on the side of the printed wiring board which supports the strip transmission lines. In this invention, prior to assembly, a portion of the lower end of the outer conductor and a portion of the dielectric insulator of the coaxial transmission line is removed to expose the center conductor (104), see FIG. 4. The coaxial transmission line 96 is positioned within the groove 94 of the lower member 90, and member 90 is mounted onto the printed wiring board by means of the mounting screws. The exposed end of the center conductor, which extends slightly past the end of the outer conductor, lies on top of the associated strip transmission line and can be soldered to the strip transmission line to provide a positive electrical path. The outer conductor of the coaxial transmission line 96 can be soldered to a pad located on the top surface of the printed wiring board and coupled to the ground plane. The impedance of the strip transmission line can be designed to match that of the coaxial transmission line, typically 50 ohms, to provide optimum transmission conditions. Next the upper member 92 of mounting member 62 is assembled over the lower member 90 to lock the coaxial transmission line in position, and, to provide a protective cover over the connections. Both the upper and lower member provide mounting holes for the bulkhead connector. The center conductor 100 of the bulkhead connector is then slidably coupled to the protruding center conductor 102 of the coaxial transmission line 96 and the connector 101 is secured to the member 62 by means of machine screws.

In the embodiment disclosed above, the coaxial transmission line-to-strip line coupler is illustrated with a printed wiring board having a strip transmission line on one side of a dielectric board and a ground plane on the obverse side of the dielectric board. In those instances where the conductive paths or traces on the printed wiring board are of a coplanar waveguide type of transmission line, the strip signal conductor and the ground plane conductor are both on a common surface of the dielectric sheet and are separated by a fixed gap. The conductive traces, both of which are on the same side of the dielectric board are routed to contact its appropriate part of the coupler. Thus, the conductive trace coupled to the signal is positioned to contact the center conductor 68 of the coupler and, the conductive trace coupled to ground is positioned to contact the outer conducting member 70 or the member 62, whichever is appropriate.

We claim:

1. A coupler for coupling a coaxial transmission line to a controlled impedance strip transmission line of a type in which a sheet of dielectric material supports a strip signal conductor on one side and a ground plane on the other, comprising an inner conductor having a longitudinal axis, a first end section and a second end section, the longitudinal axis of said first end section forming an obtuse angle with the longitudinal axis of the inner conductor, an annular ring of dielectric material disposed around said inner conductor, and an outer conducting member disposed around said dielectric material, said coupler adapted to be coupled to the strip signal conductor side of said sheet of dielectric material intermediate the edges of said sheet of dielectric material, said first end section of said inner conductor projects beyond said annular ring of dielectric material and is adapted to be tangentially aligned with and coupled to said strip signal conductor on said sheet of dielectric material intermediate the edges of said sheet of dielectric material when said coupler is coupled to the strip signal conductor side of said sheet of dielectric material, and said outer conducting member is adapted to be coupled to said ground plane on the sheet of dielectric material.

2. The coupler of claim 1 wherein said outer conductor comprises a mounting member of conductive material coupled to a coaxial transmission line receiving means and coupled to the second end section of said inner conductor, said mounting member being adapted to be coupled to the strip signal conductor said of said sheet of dielectric material intermediate the edges of said sheet of dielectric material.

3. The coupler of claim 2 wherein a mounting member of nonconductive material is coupled to a coaxial transmission line receiving means, said mounting member being adapted to be coupled to the side of the sheet of dielectric material which supports the strip signal conductor and comprises two mating parts which, when separated, expose the first end section of said inner conductor.

4. The coupler of claim 2 wherein said mounting member comprises two mating parts which, when separated, expose the first end of said inner conductor.

5. The coupler of claim 4 wherein said annular ring of dielectric material adjacent to said first end of said inner conductor has a flat, said flat being adapted to locate said first end of said inner conductor onto the top of said strip signal on the sheet of dielectric material when said mounting member is coupled to the strip signal conductor side of said sheet of dielectric material.

* * * * *